United States Patent
Hidaka et al.

(10) Patent No.: US 6,524,770 B1
(45) Date of Patent: Feb. 25, 2003

(54) HEXAARYL BIIMIDAZOLE COMPOUNDS AS PHOTOINITIATORS, PHOTOSENSITIVE COMPOSITION AND METHOD OF MANUFACTURING PATTERNS USING THE COMPOUNDS

(75) Inventors: Takahiro Hidaka, Ibaraki (JP); Makoto Kaji, Ibaraki (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 41 days.

(21) Appl. No.: 09/663,370

(22) Filed: Sep. 15, 2000

(51) Int. Cl.[7] .................................................. G03F 7/004
(52) U.S. Cl. ........................ 430/281.1; 430/270.1; 430/325; 548/342.5; 548/343.5
(58) Field of Search .................... 430/270.1, 325, 430/281.1; 548/342.5, 343.5

(56) References Cited

U.S. PATENT DOCUMENTS 4,311,783 A * 1/1982 Dessauer .................... 430/270

FOREIGN PATENT DOCUMENTS

JP   20000-186207   *   7/2000

OTHER PUBLICATIONS

JPO abstract JP2000–186207, Jul. 2000.*
CA abstract JP 2000–186207, Jul. 2000.*
Kaji et al., Rad Tech Europe 99, Exhibition & Conference for Radiation Curing, Nov. 8–10, 1999 Berlin/German "Gateway to New Horizons".

* cited by examiner

*Primary Examiner*—Rosemary Ashton
(74) *Attorney, Agent, or Firm*—Armstrong, Westerman & Hattori, LLP

(57) ABSTRACT

A hexaaryl biimidazole compound useful as a photoinitiator, represented by Formula (I):

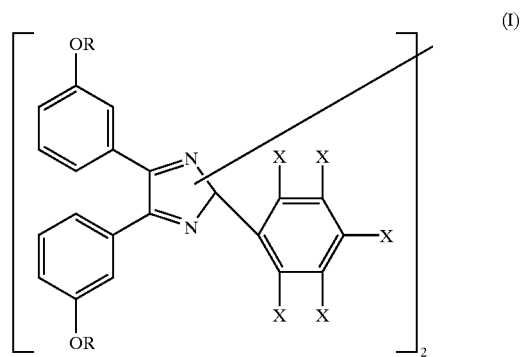

wherein each R group represents an alkyl group which may be the same or different, and each X group is independently a fluorine or hydrogen. The compound (I) is particularly useful as an initiator in a photosensitive composition containing a polyimide precursor, which is curable under patternwise low radiation exposure to give a patterned layer having heat and chemical resistance.

34 Claims, 3 Drawing Sheets

HEXAARYL BIIMIDAZOLE COMPOUNDS AS PHOTOINITIATORS, PHOTOSENSITIVE COMPOSITION AND METHOD OF MANUFACTURING PATTERNS USING THE COMPOUNDS

The present application is based on Japanese patent application No. H11-50958 filed on Feb. 26, 1999, the entire content of which is hereby incorporated by reference.

BACKGROUND

The present invention relates to a hexaaryl biimidazole (HABI) compound useful as a photopolymerization initiator, a photosensitive composition containing the compound, a method of manufacturing patterns made of the compound, and electronic components incorporating such patterns.

Photosensitive resin compositions have been used in a wide range of industrial applications such as UV inks, print screens, most recently laser holograms, and the like. Photosensitive heat resistant polymers serve not only as positive-type photoresists that make miniaturization of semiconductors possible, but also as protective coating or negative buffer coating, and as passivation film. One example of such photosensitive heat resistant material is disclosed in Japanese examined patent publications Kokoku H5-67026 and Kokoku S63-3139, which teach the reaction of an aromatic diamine compound with an aromatic tetracarboxylic dianhydride to yield a photosensitive group.

A reduced-size projection-type exposure apparatus called "stepper" is used for forming patterns in a semiconductor production line. The g-line stepper (using visible light of 435 nm wavelength generated by an ultra high-pressure mercury lamp) was commonly used previously. However, it is being replaced by the i-line stepper (using light of 365 nm wavelength) which meets the more stringent miniaturization design rules adopted in the manufacture of semiconductor devices.

Photosensitive polyimide precursors which have aromatic monomers as their skeleton provide excellent heat resistance and mechanical properties as photoresists. However, such polyimide precursors themselves absorb light. Their transmittance is low in the UV band, and particularly low in the i-line band (365 nm wavelength). The photochemical reaction in the exposed region of a layer of polyimide precursor is so small that it results in little sensitivity, thereby causing deterioration of the pattern shape obtained with the photoresist.

With the emergence of the Lead on Chip (LOC) technology, which is a high density packaging technique for semiconductor elements in which even thicker polyimide films are used, the low transmittance of polyimide precursors has become a serious problem in the lithography of semiconductor devices. Currently in demand in the market is a photosensitive polyimide having excellent sensitivity even at the bottom of the surface protective layers of semiconductor components, where the intensity of the i-line stepper is extremely reduced, therefore making possible the formation of patterns of excellent shape.

Among the components of a photosensitive resin composition, the photopolymerization initiator has the potential of having the greatest effect on the sensitivity. Commonly used photopolymerization initiators which are highly sensitive under the above described conditions include:

1. oxime ester compounds (e.g., 1-phenyl-1,2-propanedione-2-(o-ethoxy carbonyl)oxime); and
2. hexaaryl biimidazole compounds (e.g., 2,2'-bis(o-chlorophenyl)-4,4',5,5'-tetraphenyl biimidazole (known as o-Cl-HABI)).

However, oxime ester compounds generally are not stable against heat, and separation of Cl ions has been a problem with chlorine-containing hexaaryl biimidazoles such as o-Cl-HABI in semiconductor processing. Neither of these initiators have brought satisfactory results as yet. In addition, o-Cl-HABI is poorly soluble in solvents so that the amount that can be used has not been sufficient for obtaining a good sensitivity.

SUMMARY OF THE INVENTION

The present invention provides a novel hexaarylbiimidazole compound that has much better solubility and sensitivity than obtained with conventional technology, and therefore, can be used as a highly sensitive photopolymerization initiator.

The present invention also provides a photosensitive composition characterized by excellent photosensitivity and excellent pattern shaping under a low level of exposure to light.

In addition to resolving the above problems, the present invention provides a photosensitive composition containing a polyimide precursor that can form a polyimide film having excellent heat resistance and chemical resistance, and therefore, is suitable for forming a film for protecting the surface of semiconductor elements and forming interlevel dielectric films of thin layer multilevel printed circuit boards.

The present invention offers the following advantages:
the ability to form patterns having excellent photosensitivity and excellent pattern shape even under a low level of exposure;
the ability to develop the film into a pattern by reaction of the photosensitive composition with an aqueous alkali solution; and
the ability to manufacture patterns from polyimide which is a material with excellent heat resistance and chemical resistance.

Furthermore, the present invention provides electronic components having excellent reliability due to the characteristics of the above patterns.

DESCRIPTION OF THE INVENTION

Figure 1:
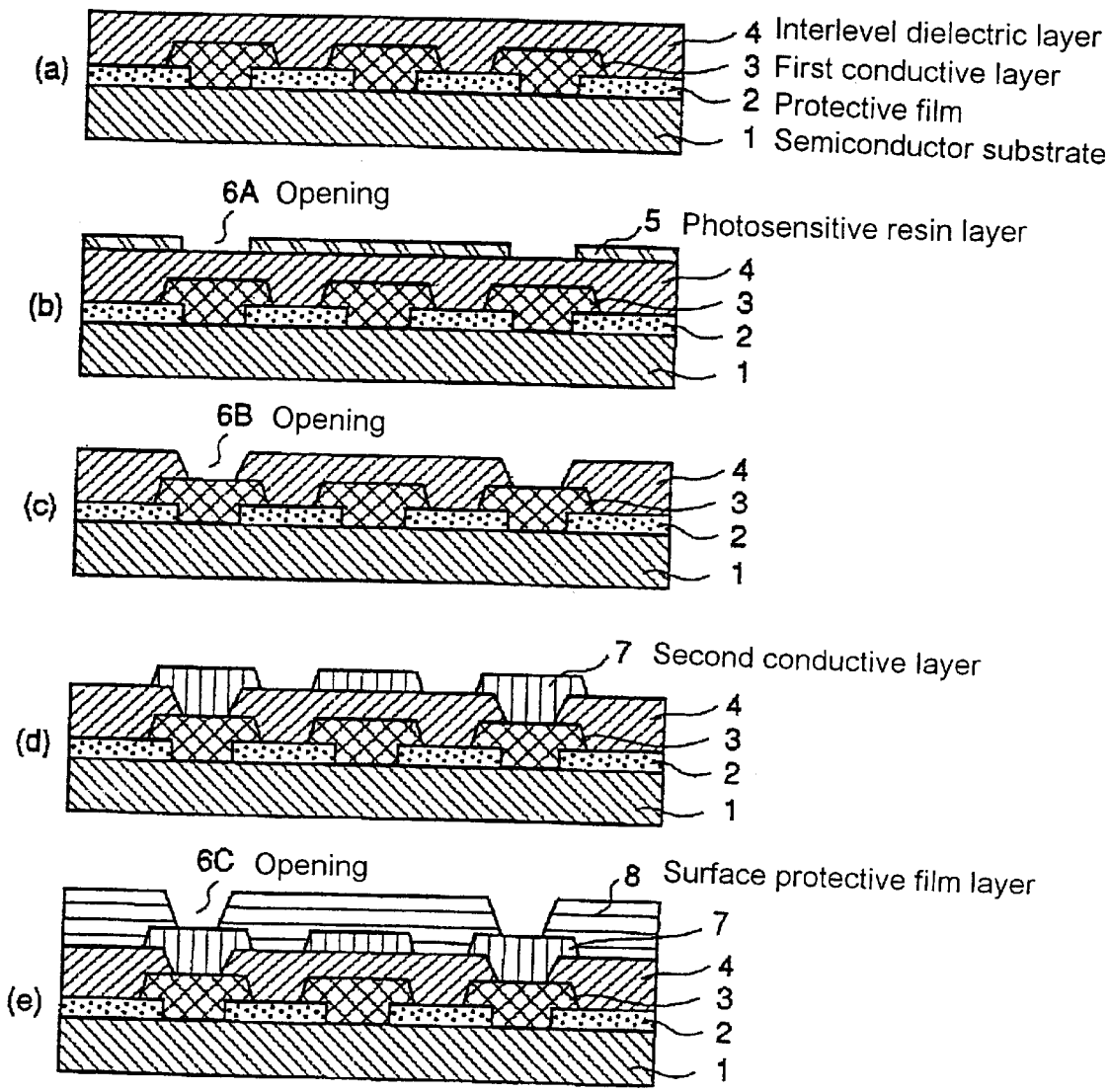
FIG. 1 shows the manufacturing process for a semiconductor device having a multilevel structure.

The inventors found novel hexaaryl biimidazole (HABI) compounds that can solve the above described problems. The present invention relates to the hexaaryl biimidazole compounds represented by Formula (I) wherein each R group represents an alkyl group which may be the same or different, and each X group is independently a fluorine or hydrogen atom. The group R preferably has 1 to 10 carbon atoms, most preferably 1 carbon atom.
}

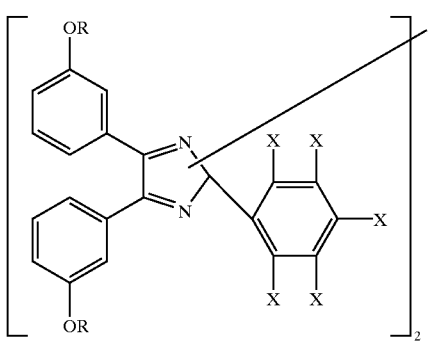

One aspect of the present invention relates to the hexaaryl biimidazole compounds wherein, in Formula (I), all four R groups are methyl groups.

Another aspect of the present invention relates to the hexaaryl biimidazole compounds wherein, in each of two benzene rings having X groups as substituents in Formula (I), two or three of those X groups are fluorine atoms.

Moreover, an aspect of the present invention relates to the hexaaryl biimidazole compounds represented by Formula (II):

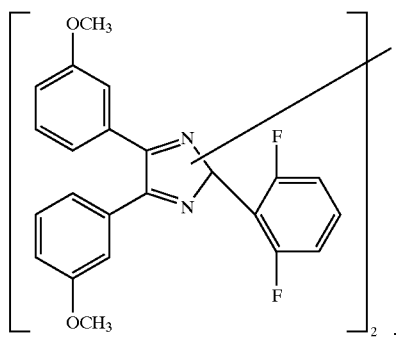

An aspect of present invention also relates to the hexaaryl biimidazole compounds represented by Formula (III):

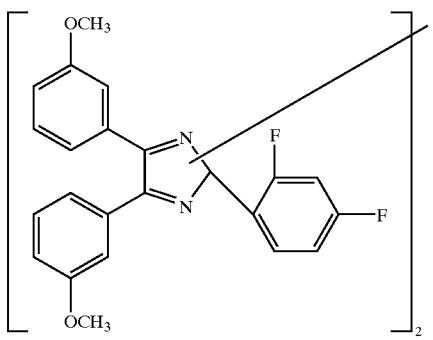

The compounds represented by Formulas (I), (II) and (III) are dimers having isomeric forms, with one isomeric form being usually predominant at room temperature. The following isomers represented by Formulas (Ia), (IIa) and (IIIa) are preferred embodiments of the invention.

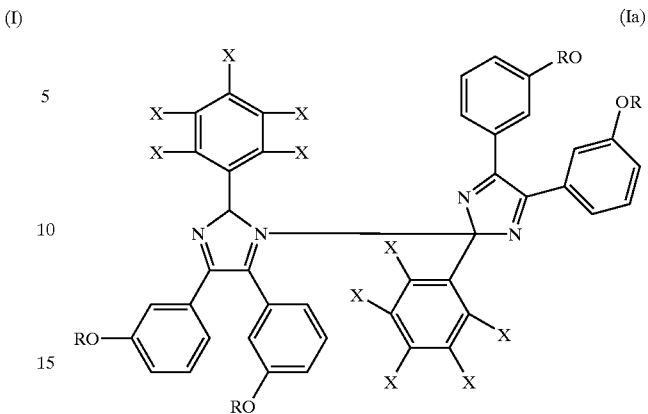

wherein each R group represents an alkyl group which may be the same or different, and each X group is independently a fluorine or hydrogen atom. The group R preferably has 1 to 10 carbon atoms, most preferably 1 carbon atom.

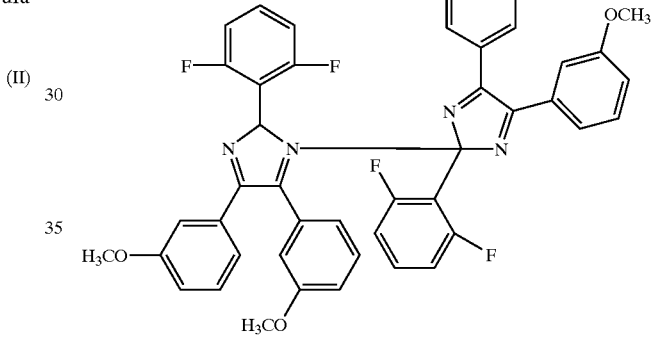

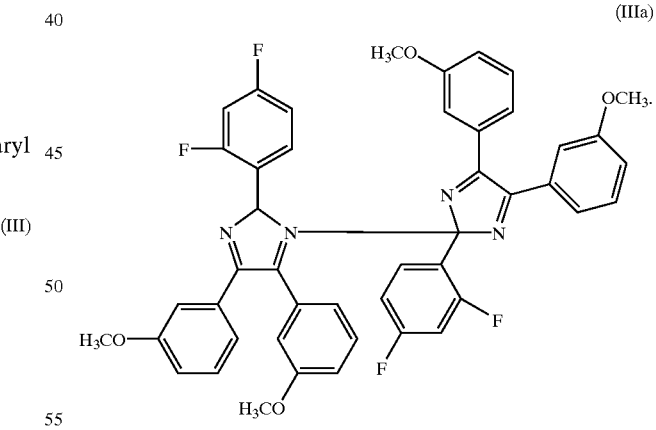

The present invention also relates to a photosensitive composition comprising:
(A) at least one photopolymerizable compound having a carbon-carbon double bond; and
(B) at least one hexaaryl biimidazole compound as described above.

In one aspect of the present invention, component (A) in the photosensitive composition is a photopolymerizable polyimide precursor having a carbon-carbon double bond.

More specifically, the present invention relates to a photosensitive composition comprising:

(1) 100 parts by weight of component (A); and
(2) 0.1–20 parts by weight of component (B).

Another aspect of the present invention relates to a photosensitive composition wherein component (A) contains a photopolymerizable compound having a boiling point of over 100° C. under atmospheric pressure.

The present invention also relates to a method of manufacturing a pattern comprising the following steps:
1. forming a film with a photosensitive composition as described above;
2. irradiating light onto the film through a mask corresponding to the desired pattern; and
3. developing the film after the irradiation step in an organic solvent or a basic aqueous solution.

The present invention relates in particular to a method of manufacturing a pattern in which the developing step is performed in a basic aqueous solution.

The present invention also relates to electric components having the above described mask pattern as a protective coating or an interlevel dielectric film.

The embodiments of the novel hexaaryl biimidazole compounds represented by Formula (I) which have at least one fluorine substituent on one of their phenyl rings have much better sensitivity as photopolymerization initiators than HABI compounds of the prior art such as o-Cl-HABI. Therefore, those hexaaryl biimidazole compounds according to the invention make possible the production of patterns having excellent shape even when the photoresist composition is patterned under a low level of radiation exposure.

The following are examples of the hexaaryl biimidazole compound represented by Formula (Ia), the invention not being limited to these examples:

2,2'-bis(2-fluorophenyl)-4,4',5,5'-tetrakis(m-methoxyphenyl)biimidazole;
2,2'-bis(2,3-difluoromethyl phenyl)-4,4',5,5'-tetrakis(m-methoxyphenyl)biimidazole;
2,2'-bis(2,4-difluorophenyl)-4,4',5,5'-tetrakis(m-methoxyphenyl)biimidazole;
2,2'-bis(2,5-difluorophenyl)-4,4',5,5'-tetrakis(m-methoxyphenyl)biimidazole;
2,2'-bis(2,6-difluorophenyl)-4,4',5,5'-tetrakis(m-methoxyphenyl)biimidazole;
2,2'-bis(2,3,4-trifluorophenyl)-4,4',5,5'-tetrakis(m-methoxyphenyl)biimidazole;
2,2'-bis(2,3,5-trifluorophenyl)-4,4',5,5'-tetrakis(m-methoxyphenyl)biimidazole;
2,2'-bis(2,3,6-trifluorophenyl)-4,4',5,5'-tetrakis(m-methoxyphenyl)biimidazole;
2,2'-bis(2,4,5-trifluorophenyl)-4,4',5,5'-tetrakis(m-methoxyphenyl)biimidazole;
2,2'-bis(2,4,6-trifluorophenyl)-4,4',5,5'-tetrakis(m-methoxyphenyl)biimidazole;
2,2'-bis(2,3,4,5-tetrafluorophenyl)-4,4',5,5'-tetrakis(m-methoxyphenyl)biimidazole;
2,2'-bis(2,3,4,6-tetrafluorophenyl)-4,4',5,5'-tetrakis(m-methoxyphenyl)biimidazole;
2,2'-bis(2,3,4,5,6-pentafluorophenyl)-4,4',5,5'-tetrakis(m-methoxyphenyl)biimidazole;
2,2'-bis(2,4-difluorophenyl)-4,4',5,5'-tetrakis(m-ethoxyphenyl)biimidazole;
2,2'-bis(2,5-difluorophenyl)-4,4',5,5'-tetrakis(m-ethoxyphenyl)biimidazole;
2,2'-bis(2,6-difluorophenyl)-4,4',5,5'-tetrakis(m-ethoxyphenyl)biimidazole, and the like.

The hexaaryl biimidazole compound of the invention can be used as a single compound or a combination of two or more compounds.

The following examples of the compounds represented by Formula (Ia) or (IIa) are highly sensitive and, therefore, particularly preferred:
2,2'-bis(2,6-difluorophenyl)-4,4',5,5'-tetrakis(m-methoxyphenyl)biimidazole (abbreviated as m-MeO-2, 6F-HABI); and
2,2'-bis(2,4-difluorophenyl)-4,4',5,5'-tetrakis(m-methoxyphenyl)biimidazole (abbreviated as m-MeO-2, 4F-HABI).

The method of preparation of the hexaaryl biimidazole compounds of the invention is not particularly limited. The compounds can be synthesized, for example, by the method described by L. A. Cescon et al., Journal of Organic Chemistry, vol. 36, pp. 2262–2267 (1971), or by the method disclosed in Japanese unexamined patent publication Kokai H10-36354.

For example, the compounds of the invention can be obtained by the procedure illustrated for the following compound:
1. dissolving 2-(difluorophenyl)-4,5-bis(m-alkoxyphenyl) imidazole into a polar solvent such as N-methylpyrrolidone, an alcohol (e.g., methanol, propanol), an ethyleneglycol alkylether, or the like, by stirring the mixture at room temperature (Solution 1);
2. slowly dropping potassium ferricyanide and an aqueous solution of sodium hydroxide into Solution 1 while maintaining the reaction temperature at 10–20° C.;
3. continuing to stir the mixture after dropping the above components until the reaction terminates;
4. filtering the reaction product and washing the same with water; and
5. drying the reaction product.

If required, the reaction product can be dissolved into a solvent such as acetone-methanol for recrystallization and purification.

The photosensitive composition of the present invention comprises:
(A) at least one photopolymerizable compound having a carbon-carbon double bond; and
(B) at least one hexaaryl biimidazole compound as described above.

The component (A) can be either a high-molecular compound having a double bond or a low-molecular compound which is photopolymerizable, or a combination of both. The type and amount of component (A) are selected to suit the targeted application.

The high-molecular compounds are polymers having a carbon-carbon double bond which are prepared from photopolymerizable compounds. Examples of these polymers include:
(1) polyesters, such as copolyesters derived from a polyhydric alcohol and a polyhydric carboxylic acid, examples of the polyhydric alcohol being diethylene glycol, triethylene glycol, tetraethylene glycol, trimethylolpropane, neopentylglycol, and the like; examples of the polyhydric carboxylic acid being terephthalic acid, isophthalic acid, sebacic acid, adipic acid, and the like;
(2) vinyl polymers which are homopolymers or copolymers of vinyl monomers such as methacrylic acid, acrylic acid, and alkylesters of methacrylic acid or acrylic acid (e.g., methyl (meth-)acrylate, ethyl (meth-)acrylate, butyl (meth-)acrylate, 2-hydroxyethyl (meth-)acrylate, phenyl (meth-)acrylate, benzyl (meth-)acrylate, 2-dimethylaminoethyl (meth-)acrylate, 2-ethylhexyl (meth-)acrylate, and the like, wherein "(meth-)acrylate" means "acrylate or methacrylate");

(3) polyformaldehydes;
(4) polyurethanes;
(5) polycarbonates;
(6) polyamides;
(7) cellulose esters (e.g., methyl cellulose, ethyl cellulose, and the like);
(8) polyamide acids;
(9) polyamide acid esters; and
(10) polyamide acid amides.

The preferable low-molecular compounds are photopolymerizable compounds having a boiling point of over 100° C. under atmospheric pressure. Those compounds having a boiling point of less than 100° C. evaporate to escape in the steps in which solvent is removed from the photoresist system by drying or a similar procedure, and the step wherein activating light is irradiated on the photoresist. Therefore, such compounds are not preferred as component (A). The low-molecular compounds used in component (A) usually have a molecular weight of less than 1,000.

Specific examples of the low-molecular compounds include:
(1) compounds obtained by condensation of a polyhydric alcohol and an α, β-unsaturated carboxylic acid, examples of which include: ethyleneglycol di(meth-)acrylate; triethyleneglycol di(meth-)acrylate; tetraethyleneglycol di(meth-)acrylate; trimethylolpropane di(meth-)acrylate; trimethylolpropane tri(meth-)acrylate; 1,2-propyleneglycol di(meth-)acrylate; di(1,2-propyleneglycol) di(meth-)acrylate; tri(1,2-propylene glycol) di(meth-)acrylate; dimethylaminoethyl (meth-)acrylate; diethylaminoethyl (meth-)acrylate; dimethylaminopropyl (meth-)acrylate; diethylaminopropyl (meth-)acrylate; 1,4-butanediol di(meth-)acrylate; 1,6-hexanediol di(meth-)acrylate; pentaerythritol tri(meth)acrylate); and
(2) vinyl compounds, examples of which include: styrene; divinylbenzene; 4-vinyltoluene; 4-vinyl pyridine; N-vinyl pyrrolidone; 2-hydroxyethyl (meth-)acrylate; 1,3(meth-)acryloyloxy-2-hydroxypropane; methylenebisacryl amide; N,N-dimethylacryl amide; N-methylolacryl amide; neopentyl glycol di(meth-)acrylate; pentaerythritol (meth-)acrylate; dipentaerythritol hexa(meth-)acrylate; tetramethylol propane tetra (meth-)acrylate.

A single compound high-molecular compound or low-molecular compound as described above may be used in component (A), or a combination of two or more compounds selected from the above high-molecular compounds or low-molecular compounds may be used in component (A).

The preferable low-molecular photopolymerizable compounds are those that are soluble in a solvent. Examples of such solvent include: acetone; methyl ethyl ketone; diethyl ketone; toluene; chloroform; methanol; ethanol; 1-propanol; 2-propanol; 1-butanol; 2-butanol; t-butanol; ethyleneglycol monomethylether; xylene; tetrahydrofuran; dioxane; cyclopentanone; N,N-dimethylacetamide; N,N-dimethylformamide; N-methyl-2-pyrrolidone; N-acetyl-2-pyrrolidone; N-benzyl-2-pyrrolidone; γ-butyrolactone; dimethylsulfoxide; ethylene carbonate; propylene carbonate; sulfolane; hexamethylene phosphortriamide; N-acetyl-ε-caprolactam; dimethyl imidazolidinone; diethyleneglycol dimethyl ether; triethyleneglycol dimethyl ether. A single solvent or a mixture of solvents may be used in the present invention.

When the photosensitive composition is used as a surface protective film or an interlevel dielectric layer in semiconductor devices, the film or layer must be resistant to heat and other stress conditions. For this reason, photopolymerizable polyimide precursors having a photopolymerizable carbon-carbon double bond are preferred as component (A).

The photopolymerizable polyimide precursors having a carbon-carbon double bond include:
(1) polyamide acid unsaturated esters having a structure in which a photopolymerizable compound having a carbon-carbon double bond is conjugated with the side chain of a polyamide acid;
(2) polyamide acid unsaturated amides having the same structure as described in (1); and
(3) polymers synthesized with a polyamide acid and an amine compound having a carbon-carbon double bond to induce an ionic bonding between a carboxyl group and an amino group, providing a carbon-carbon double bond to the polymer. It is preferable that the carbon-carbon double bond is present in the form of an acryloyl group or a methacryloyl group.

Among all, a polyamide acid unsaturated ester having recurring units represented by Formula (IV) is preferred as component (A). Combined with component (B), this polymer having recurring units represented by Formula (IV) provides excellent sensitivity and reduced developing time.

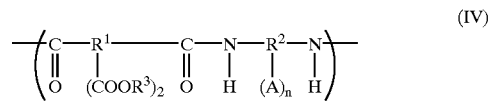

(IV)

wherein
$R^1$ is a tetravalent organic group;
$R^2$ is a divalent, trivalent or tetravalent organic group;
$R^3$ is a monovalent organic group having a carbon-carbon double bond;
A is an acidic monovalent group; and
n is 0, 1 or 2.

In the recurring unit represented by Formula (IV), the tetravalent organic group $R^1$ may be a tetracarboxylic acid or derivative thereof, such as dianhydride, diester or diamide, which is reacted with a diamine to form a polyimide precursor. In terms of the mechanical property, heat resistance, and adhesiveness of cured polyimide films, $R^1$ preferably is a tetravalent organic group having more than four carbon atoms, more preferably having a total of 6–30 carbon atoms that include aromatic rings (e.g., benzene ring, naphthalene ring). In addition, taking the ortho and para positions in the aromatic rings as a pair of bonding arrangements, a preferred arrangement for the four carboxylic groups of the tetracarboxylic acid is that the four carboxyl groups of the tetracarboxylic acid should form two pairs of ortho-para substituents in the aromatic rings. A molecule of a polyamide acid unsaturated ester contains a plurality of the recurring unit (IV), wherein all the $R^1$ groups can be the same or different from each other.

The polyamide acid unsaturated ester wherein n=1 or 2 in the recurring unit of Formula (IV) dissolves very well into a basic aqueous solution, and therefore is preferred. The group A in the recurring unit of Formula (IV) is an acidic group, which may be any one selected from the group consisting of a sulfonic acid group (—$SO_3H$), a sulfinic acid group (—$SO_2H$), a carboxylic acid group (—COOH), or a phenol-type hydroxy group, which desirably dissolves into a basic aqueous solution. A carboxyl group is preferred over other acidic groups because it is easy to synthesize polyimide precursors with a polyamide unsaturated ester having such carboxyl group. A polyamide acid unsaturated ester molecule is composed of a plurality of the recurring unit (IV), which may be the same or different from each other. If increased solubility in a basic aqueous solution is required when n=0 in the recurring unit represented by Formula (IV), $R^2$ in some units preferably should be hydrogen atoms, that is, $R^2$ should constitute a partial ester of a polyamide acid, which is a variation of the recurring unit represented by Formula (IV).

In Formula (IV), the group $R^2$ bonded to the acidic group A may be a diamine moiety that can react with the tetracarboxylic acid or its derivatives to form a polyimide precursor. For obtaining the desired mechanical properties, heat resistance, and adhesiveness, $R^2$ preferably should have aromatic rings, and more preferably should have a total of 6–30 carbon atoms that include aromatic rings. In a molecule of polyimide precursor the $R^2$ groups in different recurring units (IV) may be the same or different from each other.

The organic group $R^3$ having a carbon-carbon double bond in different recurring units (IV) may be the same or different from each other. The group $R^3$ is preferably represented by the following Formula (V), which provides higher photosensitivity.

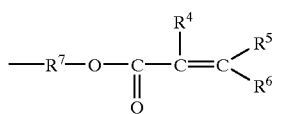

(V)

wherein each of the $R^4$, $R^5$, and $R^6$ groups represents a group independently selected from hydrogen, an allyl group, a phenyl group, and a propenyl group; and $R^7$ is a divalent organic group. The alkyl groups preferably have 1–4 carbon atoms. The divalent organic group $R^7$ is preferably an alkylene group having 1–3 carbon atoms such as a methylene group, an ethylene group, or a propylene group.

A methacryloyl oxyalkyl group and an acryloyl oxyalkyl group having 1–20 carbon atoms are preferable as the group (V) because they provide excellent sensitivity and ease of synthesis.

The polyamide acid unsaturated ester may have additional recurring units which are other than those represented by Formula (IV).

In the polyimide precursors used in the present invention, the proportion of the recurring unit represented by Formula (IV) to the total number of recurring units is preferably 10–100 mole % when n=1 or 2. This proportion provides an efficient developing performance in a basic aqueous solution and a uniformly excellent pattern shape. A proportion of the recurring unit (IV) in the range of 80–100 mole % provides even better performance. This proportion can be adjusted by varying the types and amounts of materials such as the tetracarboxylic acid or derivative thereof, the diamine and the compound having a carbon-carbon double bond.

When n=0, the proportion of the recurring unit represented by Formula (IV) to the total number of recurring units is preferably 10–100 mole %, even more preferably 30–100 mole %, for obtaining excellence in pattern shape. To increase the developing performance in a basic aqueous solution, the preferred proportion for recurring units other than the recurring unit (IV) must be determined. For example, the preferred proportion for a recurring unit of polyamide acid or polyamide acid ester, such as represented by the following formulas wherein $R^1$ and $R^7$ are as defined above, is 15–50 mole %.

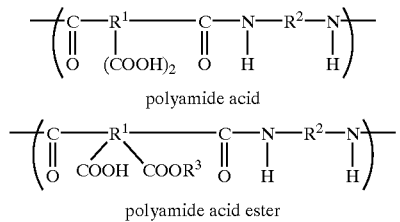

polyamide acid polyamide acid ester

The polyamide acid unsaturated ester can be synthesized by the following methods:

(1) a method in which a tetracarboxylic dianhydride and a compound containing a hydroxyl group and having an unsaturated group are mixed together to make a half-ester of the tetracarboxylic acid; then, the mixture is reacted with thionyl chloride to make an acid chloride, which is then reacted with a diamine;

(2) an acid chloride method in which the tetracarboxylic half-ester is reacted with a carbodiimide, which is a condensation agent, using a diamine;

(3) a method in which a carbodiimide condensation agent is consumed; and (4) an isoimide method, and the like.

Examples of the tetracarboxylic dianhydride include: oxydiphthalic dianhydride; 3,3',4,4'-benzophenonetetracarboxylic dianhydride; 3,3',4,4'-biphenyltetracarboxylic dianhydride; 1,2,5,6-naphthalenetetracarboxylic dianhydride; 2,3,6,7-naphthalenetetracarboxylic dianhydride; 1,4,5,8-naphthalenetetracarboxylic dianhydride; 2,3,5,6-pyridinetetracarboxylic dianhydride; 3,4,9,10-perylene tetracarboxylic dianhydride; sulfonyldiphthalic dianhydride; m-terphenyl-3,3',4,4'-tetracarboxylic dianhydride; p-terphenyl-3,3',4,4'-tetracarboxylic dianhydride; 1,1,1,3,3,3-hexafluoro-2,2'-bis(2,3- or 3,4-dicarboxy phenyl)propane dianhydride; 2,2'-bis(2,3- or 3,4-dicarboxy phenyl)propane dianhydride; 2,2'-bis(4'-(2,3- or 3,4-dicarboxyphenoxy) phenyl)propane dianhydride; 1,1,1,3,3,3-hexafluoro-2,2'-bis (4'-(2,3- or 3,4-dicarboxyphenoxy)phenyl)propane dianhydride; and aromatic tetracarboxylic dianhydrides represented by Formula (VI):

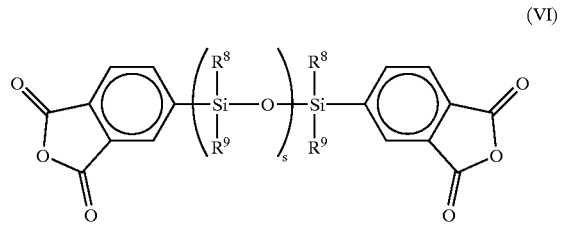

(VI)

wherein $R^8$ and $R^9$ independently are monovalent hydrocarbon groups having 1–12 carbon atoms; and s is an integer $\geq 1$.

Examples of the diamines, from which are derived the diamine portions in the recurring unit represented by Formula (IV) when n=1 or 2 in the moiety $R^2$-$(A)_n$, include: 3,5-diamino benzoic acid; 4,4'-hydroxy-3,3'-diamino biphenyl; 3,4-diamino benzoic acid; 3,3'-dihydroxy-4,4'-diamino biphenyl; 2,3-diamino-4-hydroxy pyridine; 2,2'-bis(4-hydroxy-3-aminophenyl)hexafluoro propane; 2,4-diaminophenol; 2,4-diaminobenzoic acid; 3-carboxy-4,4'-diaminodiphenyl ether; 3,3'-dicarboxy-4,4'-diaminophenylether; 3,3'-dicarboxy-4,4'- diaminodiphenylmethane; 3,3'-dicarboxy-4,4'-diaminodiphenylmethane; 3,3'-dicarboxy-4,4'-diaminobiphenyl; 3,3',5,5'-tetracarboxy-4,4'-diaminobiphenyl; 3-carboxy-4,4'-diaminodiphenylsulfone; 3,3'-dicarboxy-4,4'-diaminodiphenylsulfone; 1,1,1,3,3,3-hexafluoro-2,2'-bis(3-carboxy-4-aminophenyl)propane, or the like.

Examples of the diamines, from which are derived the diamine portions in the recurring unit represented by Formula (IV) when n=0, include:
4,4'-(or 3,4'-, or 3,3'-, or 2,4'-, or 2,2'-)diaminodiphenyl ether;
4,4'-(or 3,4'-, or 3,3'-, or 2,4'-, or 2,2'-) diaminodiphenylmethane;
4,4'-(or 3,4'-, or 3,3'-, or 2,4'-, or 2,2'-) diaminodiphenylsulfone;
4,4'-(or 3,4'-, or 3,3'-, or 2,4'-, or 2,2'-) diaminodiphenylsulfide;
p-phenylenediamine; m-phenylenediamine; p-xylenediamine; m-xylenediamine;
o-tolidine; o-tolidine sulfone; 4,4'-methylene-bis-(2,6-diethyl aniline);
4,4'-methylene-bis-(2,6-diisopropylaniline); 2,4-diaminomesitylene;
1,5-diaminonaphthalene; 4,4'-benzophenonediamine;
bis-(4-(4'-aminophenoxy)phenyl)sulfone;
1,1,1,3,3,3-hexafluoro-2,2'-bis(4-aminophenyl)propane;
2,2'-bis(4-(4'-aminophenoxy)phenyl)propane;
3,3'-dimethyl-4,4'-diamino-diphenylmethane;
3,3',5,5'-tetramethyl-4,4'-diaminophenylmethane;
bis (4-(3'-aminophenoxy)phenyl)sulfone;
2,2'-bis(4-aminophenyl)propane; and the like.

A single compound or a combination of different diamine compounds as described above may be used.

Diamines such as a diaminopolysiloxane represented by Formula (VI) may be used as a portion of the diamine component to provide improved adhesiveness.

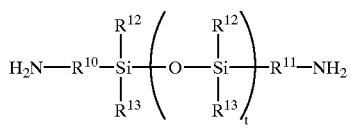

(VII)

wherein $R^{10}$ and $R^{11}$ are bivalent hydrocarbon groups which may be identical or different from each other, and $R^{12}$ and $R^{13}$ are monovalent hydrocarbon groups which may be identical or different from each other. Examples of the bivalent hydrocarbon group include: (1) a lower alkylene group (e.g., methylene, ethylene, propylene, etc.); and (2) a monocyclic arylene group (e.g., phenylene). Both $R^{10}$ and $R^{11}$ may be such alkylene groups, or both $R^{10}$ and $R^{11}$ may be such arylene groups. Alternatively, one of $R^{10}$ and $R^{11}$ may be an alkylene group and the other may be an arylene group. Examples of the monovalent hydrocarbon group include: (1) a lower alkyl group (e.g., methyl, ethyl); and (2) a monocyclic aryl group. Both $R^{12}$ and $R^{13}$ may be such alkyl groups, or both $R^{10}$ and $R^{11}$ may be such aryl groups. Alternatively, one of $R^{12}$ and $R^{12}$ may be an alkyl group and the other may be an aryl group. The proportion of the diamines (VII) to the total amine component is preferably 1–30 mole %.

To obtain improved heat resistance, diamine compounds having a sulfonamide group or carboxyamide group may be used as a portion of the total diamine component. Examples of such diamine compounds having a sulfonamide group or carboxyamide group are:

4,4'-diaminodiphenyl ether-3-sulfonamide;
3,4'-diaminodiphenyl ether-4-sulfonamide;
3,4'-diaminodiphenyl ether-3'-sulfonamide;
3,3'-diaminodiphenyl ether-4-sulfonamide;
4,4'-diaminodiphenyl ether-3-carboxyamide;
3,4'-diaminodiphenyl ether4-carboxyamide;
3,4'-diaminodiphenyl ether-3'-carboxyamide;
3,3'-diaminodiphenyl ether-4-carboxyamide, and the like.

The proportion of those diamine compounds having a sulfonamide group or carboxyamide group to the total amine component is 1–30 mole %.

A single diamine compound may be used or the combination of two or more different types of diamine may be used.

The preferred molecular weight for the polyimide precursor (A) in the present invention is 10,000–200,000, in terms of weight-average molecular weight, which gives excellent film properties to the cured imidized film. A molecular weight in the range of 20,000–80,000 is even more preferable. If the molecular weight is over 10,000, the resulting mechanical strength of the film tends to degrade; if it is less than 200,000, the resulting developing performance tends to deteriorate. The weight-average molecular weight measurement can be obtained by gel permeation chromatography (GPC) and the result is expressed as a polystyrene conversion factor.

The preferred amount of the hexaaryl biimidazole compound (B) in the photosensitive composition of the invention is 0.1–20 parts by weight of (B) to 100 parts by weight of component (A), more preferably 0.1–10 parts by weight of (B) to 100 parts of (A), and even more preferably 0.5–10 parts by weight of (B) to 100 parts of (A).

In the embodiment of the photopolymerizable composition of the invention wherein component (A) contains a polyimide precursor, component (A) preferably should contain a photopolymerizable compound having a boiling point of over 100° C. under atmospheric pressure. The amount of the addition polymerizable compound is preferably 5–50 parts by weight to 100 parts by weight of the polyimide precursor.

The photosensitive composition of the invention can be sensitized even better by adding a hydrogen donor to the photopolymerization initiator system. Known hydrogen donors (e.g., amines, or the like) may be used. Particularly suitable hydrogen donors are arylglycine compounds and mercapto compounds.

Examples of the arylglycine compounds suitable as hydrogen donors in the present invention include: N-phenylglycine (NPG), N-(p-chlorophenyl)glycine, N-(p-bromophenyl)glycine, N-(p-cyanophenyl)glycine, N-(p-methylphenyl)glycine, N-methyl-N-phenylglycine, N-(p-bromophenyl)-N-methylglycine, N-(p-chlorophenyl)-N-ethylglycine, and the like.

Examples of the mercapto compounds suitable as hydrogen donors in the present invention include: mercaptobenzoxazole; mercaptobenzothiazole; mercaptobenzoimidazole; 2,5-mercapto-1,3,4-thiadiazole; 1-phenyl-5-mercapto-1H-tetrazole; 5-methyl-1,3,4-thiadiazole-2-thiol; 3-mercapto-4-methyl-4H-1,2,4-triazole; and the like.

The desirable proportion of hydrogen donor is 0.1–15 parts by weight, preferably 0.5–10 parts by weight, of the hydrogen donor to 100 parts of component (A).

The photosensitive composition of the invention may also contain optionally a sensitizer other than a hydrogen donor in its photopolymerization initiator system. Examples of such sensitizers include: 7-N,N-diethylamino coumarin; 3,3'-carbonylbis (7-N,N-diethylamino) coumarin;

3-thienylcarbonyl-7-N,N-diethyl amino coumarin; 3-benzoyl coumarin; 3-benzoyl-7-N,N-methoxy coumarin; 3-(4'-methoxybenzoyl) coumarin; 3,3'-carbonylbis-5,7-(dimethoxy) coumarin; coumarin 1 (i.e., 7-diethylamino-4-methyl coumarin); coumarin 2 (i.e., 4,6-dimethyl-7-ethylamino coumarin); coumarin 138 (i.e., 7-diethylamino cyclopenta coumarin); dimethyaminobenzophenone; diethylaminobenzophenone (EAB); 4,4'-bis(N-ethyl, N-methyl) benzophenone (MEAB); and the like.

There is no particular limitation on the amount of sensitizer, which may vary depending on its molecular weight and molar extinction coefficient under the 365 nm wavelength. A suitable amount of the sensitizer, for example for obtaining suitable optical density when the compound is exposed to the i-line, is 0.1–1.0 parts by weight, more preferably 0.1–2.0 parts by weight, to 100 parts by weight of component (A).

Each of the components of the photosensitive composition of the invention is usually dissolved or dispersed in an organic solvent. Examples of suitable solvents are: acetone; methylethylketone; diethylketone; toluene; chloroform; methanol; ethanol; 1-propanol; 2-propanol; 1-butanol; 2-butanol; t-butanol; ethyleneglycol monomethyl ether; xylene; tetrahydrofuran; dioxane; cyclopentanone; N,N-dimethyl acetoamide; N,N-dimethylformamide; N-methyl-2-pyrrolidone; N-acetyl-2-pyrrolidone; N-benzyl-2-pyrrolidone; γ-butyrolactone; dimethylsulfoxide; ethylene carbonate; propylene carbonate; sulfolane; hexamethylenephosphortriamide; N-acetyl-ε-caprolactam; dimethylimidazolidinone; diethyleneglycol dimethyl ether; triethyleneglycol dimethyl ether; and the like. A single solvent or a combination of solvents may be used. There is no particular restriction on the amount of solvent used; however, 10–90 weight % of the total weight of the composition is usually suitable.

Other additives such as a plasticizer, an adhesion promoter, and the like may be added to the photosensitive composition of the present invention.

The manufacturing method of the present invention provides patterns made of a film of the cured photosensitive composition; and films formed from the composition by a lithography technique and cured.

To make a pattern from the embodiment of the composition according to the present invention which contains a polyimide precursor, first, a film of the photosensitive composition is coated over the surface of a supporting substrate. To increase adhesiveness between the coating or heat-cured polyimide film and the supporting substrate, the surface of the supporting substrate may be treated with an adhesive in advance.

The film of the photosensitive composition having a polyimide precursor can be fabricated depending on the viscosity of varnish and other similar factors by selecting an appropriate means from methods such as spin coating, impregnation, ink-jet printing, screen printing and the like. The film thickness can be adjusted by varying the coating conditions, the solid concentration of the composition, and other related parameters. The film can also be fabricated by the following process: coating a film over a supporting member; peeling the coating from the supporting member to make a sheet of a polyimide precursor composition; and attaching the sheet on the surface of the supporting substrate.

Then, light (UV or other radiation) is irradiated on the film via a photomask corresponding to the desired pattern. The unexposed area is removed by an organic solvent or a basic aqueous solution to make a desired relief pattern. The i-line can be used as the source of light for this radiation exposure.

A developing apparatus for a positive-type photoresist may be used in the developing step. The solvent for the developing step may be an organic solvent; however, for environmental friendliness, a basic aqueous solution is preferable.

Examples of organic solvents for the developing step include: γ-butyrolactone, cyclopentanone, N-methylpyrrolidone, dimethyl sulfoxide, dimethyl acetoamide, and a mixture of these.

The basic aqueous solution may be prepared by dissolving a basic compound into water. The concentration of the basic compound is usually 0.1–50 weight %; preferably in the range of 0.1–30 weight % because the supporting substrate is little affected in that range. To improve the solubility of the polyimide precursors, the basic aqueous solution used in the developing step may contain an aqueous organic solvent such as methanol; ethanol; propanol; isopropyl alcohol; N-methyl-2-pyrrolidone; N,N-dimethylformamide; N,N-dimethyl acetoamide; and the like.

Examples of the basic compound are: hydroxide or carbonate of alkaline metals, alkaline earth metal, or ammonium ions and amines. Specifically, examples of suitable basic compounds are: 2-dimethylamino ethanol; 3-dimethylamino-1-propanol; 4-dimethylamino-1-butanol; 5-dimethylamino-1-pentanol; 6-dimethylamino-1-hexanol; 2-dimethylamino-2-methyl-1-propanol; 3-dimethylamino-2, 2-dimethyl 1-propanol; 2-diethylaminoethanol; 3-diethylamino-1-propanol; 2-diisopropylamino ethanol; 2-di-n-butylamino ethanol; N,N-dibenzyl-2-aminoethanol; 2-(2-dimethylaminoethoxy)ethanol; 2-(2-diethylaminoethoxy)ethanol; 1-dimethylamino-2-propanol; 1-diethylamino-2-propanol; N-methyldiethanolamine; N-ethyldiethanolamine; N-n-butyldiethanolamine; N-t-butyldiethanolamine; N-lauryldiethanolamine; 3-diethylamino-1,2-propanediol; triethanolamine; triisopropanolamine; N-methylethanolamine; N-ethylethanolamine; N-n-butylethanolamine; N-t-butylethanolamine; diethanolamine; diisopropanolamine; 2-aminoethanol; 3-amino-1-propanol; 4-amino-1-butanol; 6-amino-1-hexanol; 1-amino-2-propanol; 2-amino-2,2-dimethyl-1-propanol; 1-amino butanol; 2-amino-1-butanol; N-(2-amino ethyl)ethanol amine; 2-amino-2methyl-1,3-propanediol; 2-amino-2-ethyl-1,3-propanediol; 3-amino-1,2-propanediol; 2-amino-2-hydroxy methyl-1,3-propanediol; sodium hydroxide; potassium hydroxide; ammonium hydroxide; sodium carbonate; potassium carbonate; ammonium carbonate; sodium bicarbonate; potassium bicarbonate; ammonium bicarbonate; tetramethyl ammonium hydroxide; tetraethylammonium hydroxide; tetrapropylammonium hydroxide; tetraisopropyl ammonium hydroxide; amino methanol; 2-aminoethanol; 3-aminopropanol; 2-aminopropanol; methylamine; ethylamine; propylamine; isopropylamine; dimethylamine; diethylamine; dipropylamine; diisopropylamine; trimethylamine; triethylamine; tripropylamine; triisopropylamine. However, any compound other than the above can be used as long as it is soluble in water and the resulting aqueous solution is basic.

An embodiment of the present invention is a relief pattern made of polyimide by thermal treatment at a temperature selected from the 150–450° C. range. This pattern has excellent resolution, heat resistance, and mechanical properties.

The embodiment of the photosensitive composition of the invention which contains a polyimide precursor can be used in electronic components such as semiconductor devices or multi layer print circuit boards. Specifically, it is suitable as a surface protective coating for a semiconductor device, as interlevel dielectric films, and particularly interlevel dielectric films for multi layer printed circuit boards.

The electronic components of the present invention are not limited to the applications mentioned above, and may be other components having surface protective films or interlevel dielectric layers made with the composition of the invention. The electronic components can be of any structure.

One example of electronic component according to the invention is described below with reference to a manufacturing process for a semiconductor device.

FIG. 1 is a process flow chart showing the manufacture of a semiconductor device having a multilevel interconnect structure. In FIG. 1, the semiconductor substrate 1 (e.g., Si substrate) having a circuit element is coated with protective film 2 made of $SiO_2$ or other suitable material, except for given portions of the circuit element. First conductive layer 3 is fabricated on the exposed circuit element. Interlevel dielectric layer 4, made of polyimide resin or the like, is coated on the semiconductor substrate over the first conductive layer by a spin-coat technique or the like. (Step (a)).

Photosensitive resin layer 5 of chlorinated rubber or phenol novolac system is spin coated on interlevel dielectric film 4. Opening 6A is made such that the given areas of interlevel dielectric film 4 can be exposed to light during photolithography by known technology. (Step (b)).

The given areas of interlevel dielectric film 4 exposed through opening 6A described in the previous step are selectively etched by dry etching, which is a gaseous phase process using a gas (e.g., oxygen, carbon fluoride ($CF_4$), or the like), creating opening 6B. Then, photosensitive resin layer 5 is completely removed, without corroding first conductive layer 3 that is exposed through opening 6B, by selecting an etching solution that removes photosensitive resin layer 5 only. (Step (c)).

Second conductive layer 7 is fabricated, also by known photolithography technology, such that it is electrically connected to first conductive layer 3 completely. (Step (d)).

The layers of a multilevel interconnect structure having more than three layers can be fabricated by repeating the above steps.

Then, the surface protective film 8 is formed. (Step (e). In the example shown in FIG. 1, the photosensitive polymer composition is spin coated thereon and is cured. Light is irradiated through a mask having a pattern for the fabrication of opening 6C. The film is developed in a developing liquid to form a pattern, and is heated to make a polyimide film. The polyimide film protects the conductive layer from external stress, from the α-line radiation, and the like. The resulting semiconductor device has excellent reliability.

In the above example, the interlevel dielectric film can also be made with the photosensitive polyimide precursor composition of the present invention. By using such a method, the steps of resist coating and etching can be eliminated.

EXAMPLES

The present invention is further illustrated by the following examples, to which the invention is not intended to be limited in any way.

Synthesis Example: Polyimide Precursor Synthesis
(1) Acid Chloride Synthesis

In a 200 ml tetra-neck flask, 9.42 g (0.032 mole) of 3,3',4,4'-biphenyltetracarboxylic dianhydride (BPDA), 8.32 g (0.064 mole) of 2-hydroxyethyl methacrylate (HEMA), 5.06 g (0.064 mole) of pyridine, 0.03 g of t-butyl catechol, and 70 ml of N-methyl 2-pyrrolidone (NMP) were placed.

The mixture was stirred at 60° C.; the solution became transparent in 2 hours. The mixture was again stirred for 7 hours at room temperature; the flask was chilled in an ice bath and 9.88 g (0.083 mole) of thionyl chloride was dropped in for 10 minutes; then, the solution was stirred for an hour at room temperature. A solution containing an acid chloride was obtained.

(2) Polyimide Precursor (Ester of Polyamide Acid)

In another 200 ml tetra-neck flask, 4.72 g (0.031 mole) of 3,5-diaminobenzoate, 5.06 g (0.064 mole) of pyridine, 5.06 g (0.064 mole) of pyridine, 0.03 g of t-butyl catechol, and 50 ml of N-methyl-2-pyrrolidone (NMP) were placed; the flask was chilled in an ice bath. The mixture was stirred maintaining the temperature at 10° C. or less, and the acidic chloride solution obtained previously was dropped slowly for an hour into the mixture in the flask. Then, the solution was stirred for an hour at room temperature, and was then poured into 1 liter of water. The precipitated polymer was filtered and washed with water twice and vacuum dried. The process yielded 22 g of polyamide acid ester. The weight-average molecular weight was measured by gel permeation chromatography (GPC). The obtained polystyrene conversion factor was 44,000.

Example 1

Preparation of 2,2'bis(2,6-difluorophenyl)-4,4',5,5'-tetrakis(m-methoxyphenyl)biimidazole (Abbreviated as m-MeO-2, 6F-HABI)

3.5 g of 2-(2,6-difluorophenyl)-4,5-bis(m-methoxyphenyl)imidazole was mixed with 20 g of N-methylpyrrolidone by stirring at room temperature. To the resulting mixture, a solution of 6.0 g of potassium ferricyanide and 3.6 g of sodium hydroxide dissolved in 100 ml of water was dropped slowly, maintaining the reaction temperature at 10–20° C. The resulting solution was continued to be stirred at room temperature for 10 hours after completion of the dropping step. Upon termination of the reaction, the reaction product was filtered and washed with water and dried. The reaction product was then recrystallized with acetone-methanol to obtain the final product, 2,2'-bis(2,6-difluorophenyl)-4,4',5,5'-tetrakis(m-methoxyphenyl) biimidazole (abbreviated as m-MeO-2, 6F-HABI) which is a white powder.

Purity: 98.1% (HPLC)

Melting point: 172° C. (DSC); λ max: 259 (in acetonitrile)

Figure 2:
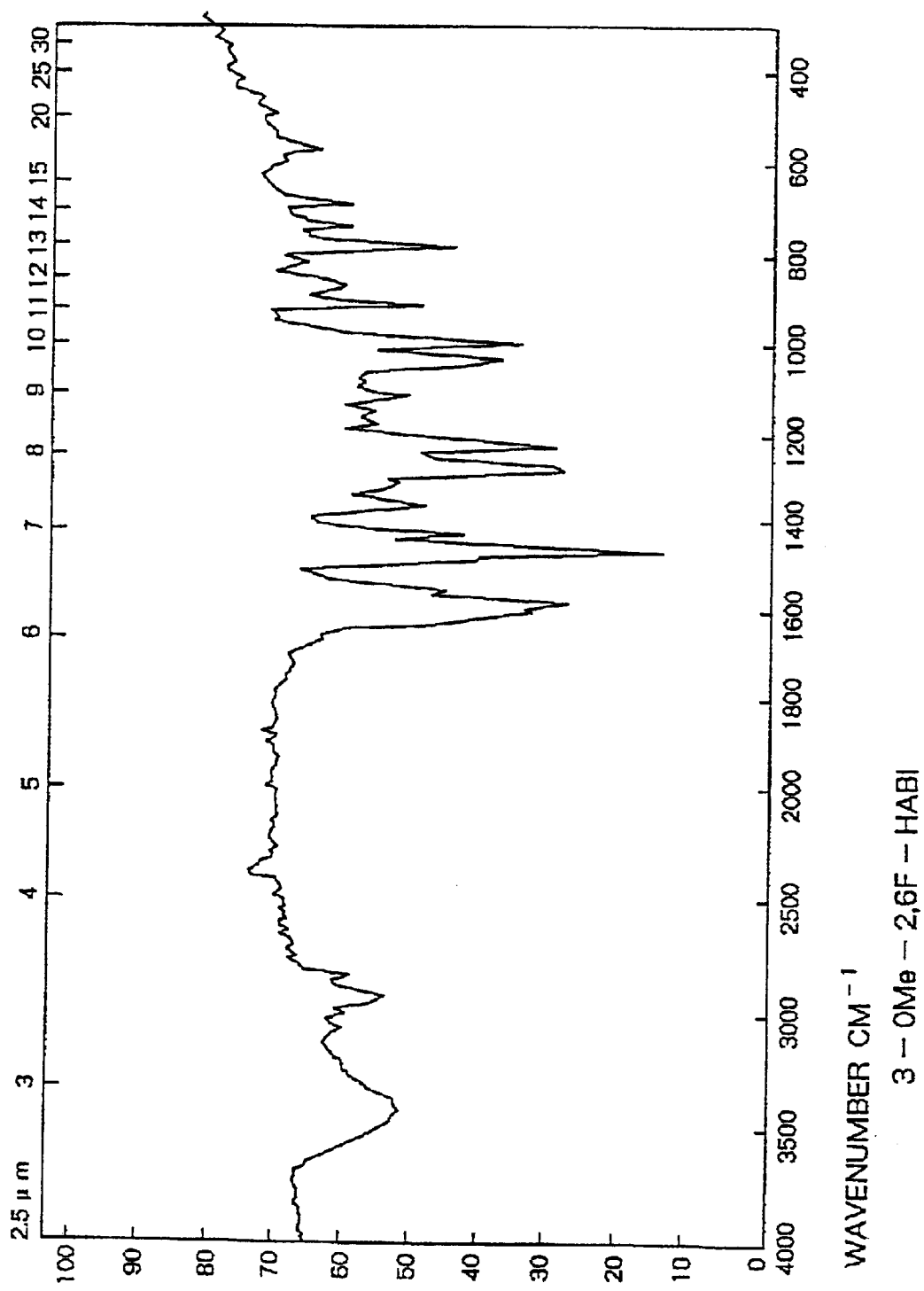
FIG. 2 shows the infrared spectrum of 2,2'-bis(2,6-difluorophenyl)-4,4',5,5'-tetrakis(m-methoxyphenyl) biimidazole.

Infrared absorption spectrum: As shown in FIG. 2.

Elemental analysis: As shown in Table 1.

TABLE 1

| | Element (weight %) | | |
|---|---|---|---|
| | C | H | N |
| Theoretical value | 70.58 | 4.38 | 7.16 |
| Analyzed value | 70.55 | 4.27 | 7.06 |

Example 2

Preparation of 2,2'-bis(2,4-difluorophenyl)-4,4',5,5'-tetrakis(m-methoxyphenyl)biimidazole (Abbreviated as m-MeO-2, 4F-HABI)

3.55 g of 2-(2,4-difluorophenyl)-4,5-bis(m-methoxyphenyl)imidazole was mixed with 20 g of N-methylpyrrolidone by stirring at room temperature. To the resulting mixture, a solution of 6.0 g of potassium ferricyanide and 3.6 g of sodium hydroxide dissolved in 100 ml of water was dropped slowly, maintaining the reaction temperature at 10–20° C. The resulting solution was continued to be stirred at room temperature for 10 hours after completion of the dropping step. Upon termination of the reaction, the reaction product was filtered, washed with water, and dried. The reaction product was then recrystallized with acetone-methanol to obtain the final product, 2,2'-bis(2,4-difluorophenyl)-4,4',5,5'-tetrakis(m-methoxyphenyl) biimidazole (abbreviated as m-MeO-2, 4F-HABI) which is a light yellow powder.

Figure 3:
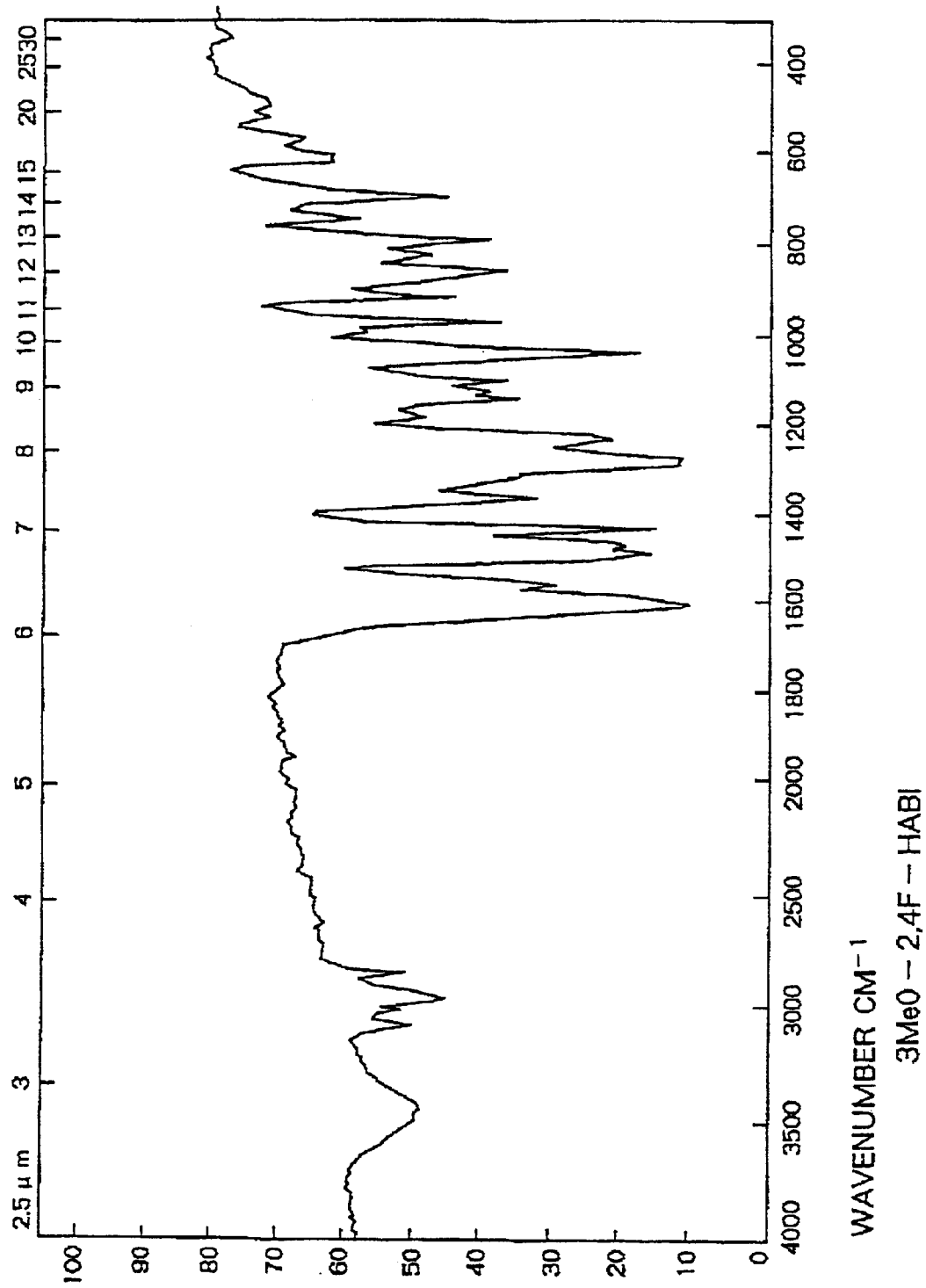
FIG. 3 shows the infrared spectrum of 2,2'-bis(2,4-difluorophenyl)-4,4',5,5'-tetrakis(m-methoxyphenyl) biimidazole.

Purity: 99.8% (HPLC)
Melting point: 152° C. (DSC); λ max: 260 (in acetonitrile)
Infrared absorption spectrum: As shown in FIG. 3.
Elemental analysis: As shown in Table 2.

TABLE 2

| | Element (weight %) | | |
|---|---|---|---|
| | C | H | N |
| Theoretical value | 70.58 | 4.38 | 7.16 |
| Analyzed value | 70.46 | 4.19 | 7.08 |

Example 3 and Control 1

(1) Preparation of Photosensitive Polyimide Precursor Composition 10 g of the polyimide precursor obtained in the Synthesis Example was stirred with a mixture of 10 g of γ-butyrolactone and 2 g of cyclopentanone. To the resulting mixture, 2.5 g of tetraethyleneglycol diacrylate monomer, and a photosensitizer as shown in Table 3 were added. The product was filtered with 3 μm-type filter paper under pressure to give a solution of photosensitive polyimide precursor composition.

TABLE 3

| | Example 3 (parts by weight) | Control 1 (parts by weight) |
|---|---|---|
| Cl-HABI | 0.0 | 6.0 |
| m-OMe-2, 6F-HABI | 6.0 | 0.0 |
| NPG | 2.0 | 2.0 |

* The above table shows the proportion of photopolymerization initiator and hydrogen donor to 25 parts by weight of monomer and 100 parts by weight of photosensitive polyimide precursor.
Cl-HABI: 2,2'-bis(o-chlorophenyl)-4,4',5,5'-tetraphenyl biimidazole (commercially available).
m-OMe-2, 6F-HABI: 2,2'-bis(2,6-difluorophenyl)-4,4',5,5'-tetrakis(m-methoxyphenyl)biimidazole.
NPG: N-phenylglycine.

(2) Pattern Formation

The photosensitive polyimide precursor composition prepared in section (1) was spin coated on a silicon wafer. The coated wafer was baked on a hot plate at 90° C. for 200 seconds to obtain a 14 μm thick film thickness. The coating film was taken into the i-line stepper and exposed to 40 mJ/cm², 80 mJ/cm², 120 mJ/cm², 160 mJ/cm², 200 mJ/cm², 240 mJ/Cm², 280 mJ/cm², 320 mJ/cm², and 360 mJ/cm². Two types of mask pattern were used and the result was evaluated in the following categories:

(1) the pattern of openings, for resolution; and
(2) the pattern of islands, for closeness of microscopic lines.

The coated film was then developed by being impregnated with 2.38 weight % or 8.10 weight % of tetramethyl ammonium hydroxide solution, and was further washed with water.

The developed pattern was observed and measurements were taken for its film thickness and the pattern shape. The sensitivity was evaluated based on the following factors (shown in Table 4): (1) sensitivity indicated by ($E_{1/2}$), which is expressed in terms of exposure (mJ/cm²) required to obtain a final film thickness of 7 μm (film gain: 50%); and (2) practical sensitivity in terms of exposure (mJ/cm²) required to obtain a resolution of 8 μm for the openings-islands pattern.

TABLE 4

| Sensitivity Evaluation | | |
|---|---|---|
| | Example 3 | Control 1 |
| Sensitivity ($E_{1/2}$) | 40 | 160 |
| Practical Sensitivity | 80 | 240 |

The pattern obtained in Example 3 was heated at 100° C. for 30 minutes, at 200° C. for 30 minutes, and at 350° C. for 60 minutes under a nitrogen atmosphere to obtain a polyimide pattern. The resulting polyimide pattern was 7.0 μm thick and had excellent pattern characteristics.

Example 4 and Control 2

(1) Preparation of Polyimide Precursor Composition 10 g of the polyimide precursor obtained in the Synthesis Example was stirred with a mixture of 16 g of N-methylpyrrolidone and 2 g of cyclopentanone. To the resulting mixture, 2.0 g of tetraethyleneglycol dimethacrylate monomer, and a photoinitiator system as shown in Table 5 were added. The product was filtered with a 3 μm-type filter paper to give a solution of photosensitive polyimide precursor composition.

TABLE 5

| | Example 4 (parts by weight) | Control 2 (parts by weight) |
|---|---|---|
| Cl-HABI | 0.0 | 6.0 |
| m-OMe-2, 6F-HABI | 6.0 | 0.0 |
| NPG | 2.0 | 2.0 |
| MEAB | 0.0 | 0.3 |

* The above table shows the proportion of photopolymerization initiator, hydrogen donor, and sensitizer to 20 parts by weight of monomer and 100 parts by weight of photosensitive polyimide precursor.
MEAB: 4,4'-bis(N-ethyl,N-methyl)benzophenone.

(2) Pattern Formation

The photosensitive polyimide precursor composition prepared in section (1) was spin coated on a silicon wafer. The coated wafer was baked on a hot plate at 90° C. for 200 seconds to obtain a 18 μm thick film. The coated film was taken into the i-line stepper and exposed to 40–360 (mJ/cm²) in 40 (mJ/cm²) steps as described above. The coated film was then developed by being impregnated with γ-butyrolactone/butyl acetate, and was further washed with propylene glycol monomethylether acetate.

The developed pattern was observed and measurements were taken for its film thickness and the pattern shape. The sensitivity was evaluated based on the following factors (shown in Table 6): (1) sensitivity indicated by ($E_{1/2}$), which is expressed in terms of exposure (mJ/cm²) required to obtain a final film thickness of 6 μm (film gain: 50%); and (2) practical sensitivity in terms of exposure (mJ/cm²) required to obtain a resolution of 6 μm for the pattern of openings.

TABLE 6

Sensitivity Evaluation

|  | Example 4 | Control 2 |
|---|---|---|
| Sensitivity ($E_{1/2}$) | 40 | 160 |
| Practical Sensitivity | 80 | 280 |

The pattern obtained in Example 4 was heated at 100° C. for 30 minutes, at 200° C. for 30 minutes, and at 350° C. for 60 minutes under a nitrogen atmosphere to obtain a polyimide pattern. The resulting polyimide pattern was 9.0 μm thick and had excellent pattern characteristics.

Example 5 and Control 1

(1) Preparation of Photosensitive Polyimide Precursor Composition 10 g of the polyimide precursor obtained in the Synthesis Example was stirred with a mixture of 16 g of γ-butyrolactone and 2 g of cyclopentanone. To the resulting mixture, 2.5 g of tetraethyleneglycol diacrylate monomer, and a photosensitizer as shown in Table 7 were added. The product was filtered with a 3 μm-type filter paper under pressure to give a solution of photosensitive polyimide precursor composition.

TABLE 7

|  | Example 5 (parts by weight) | Control 1 (parts by weight) |
|---|---|---|
| Cl-HABI | 0.0 | 6.0 |
| m-OMe-2, 4F-HABI | 6.0 | 0.0 |
| NPG | 2.0 | 2.0 |

\* The above table shows the proportion of photopolymerization initiator and hydrogen donor to 25 parts by weight of monomer and 100 parts by weight of photosensitive polyimide precursor. m-OMe-2, 4F-HABI: 2,2'-bis (2,4-difluorophenyl)-4,4',5,5'-tetrakis (m-methoxyphenyl) biimidazole.

(2) Pattern formation

The photosensitive polyimide precursor composition prepared in Example 5 was spin coated on a silicon wafer. The coated wafer was baked on a hot plate at 90° C. for 200 seconds to obtain a 14 μm thick film. The coated film was taken into the i-line stepper and exposed to 40–360 (mJ/cm²) in 40 (mJ/cm²) steps, as described in Example 3. Two mask patterns were used and the result was evaluated based on the following factors:

(1) the pattern of openings, for resolution; and
(2) the pattern of islands, for closeness of microscopic lines.

The coated film was then developed by being impregnated with 2.38 weight % or 8.10 weight % of tetramethylammonium hydroxide aqueous solution, and was further washed with water.

The developed pattern was observed and measurements were taken for its film thickness. The sensitivity was evaluated based on the following factors (shown in Table 8):

(1) sensitivity indicated by ($E_{1/2}$), which is expressed in terms of exposure (mJ/cm²) required to obtain a final film thickness of 8 μm (film gain: 50%).
(2) practical sensitivity in terms of exposure (mJ/cm²) required to obtain resolution of 8 μm for the openings-islands pattern.

TABLE 8

Sensitivity Evaluation

|  | Example 5 | Control 1 |
|---|---|---|
| Sensitivity ($E_{1/2}$) | 40 | 160 |
| Practical Sensitivity | 80 | 240 |

The resulting pattern was heated at 100° C. for 30 minutes, at 200° C. for 30 minutes, and at 350° C. for 60 minutes under a nitrogen atmosphere to obtain a polyimide pattern. The resulting polyimide pattern was 7.0 μm thick and had excellent pattern characteristics.

Example 6

(1) Preparation of Photosensitive Polyimide Precursor Composition 10 g of the polyimide precursor obtained in the Synthesis Example was stirred with a mixture of 16 g of N-methylpyrrolidone and 2 g of cyclopentanone. To the resulting mixture, 2.0 g of tetraethyleneglycol dimethacrylate monomer, and a photosensitizer as shown in Table 9 were added. The product was filtered with a 3 μm-type filter paper under pressure to give a solution of photosensitive polyimide precursor composition.

TABLE 9

|  | Example 6 (parts by weight) | Control 2 (parts by weight) |
|---|---|---|
| Cl-HABI | 0.0 | 6.0 |
| m-OMe-2, 4F-HABI | 6.0 | 0.0 |
| NPG | 2.0 | 2.0 |
| MEAB | 0.3 | 0.3 |

The above table shows the proportion of photopolymerization initiator, hydrogen donor, and sensitizer to 20 parts by weight of monomer and 100 parts by weight of photosensitive polyimide precursor.

(2) Pattern Formation

The photosensitive polyimide precursor composition prepared in section (1) was spin coated on a silicon wafer. The coated wafer was baked on a hot plate at 90° C. for 200 seconds to obtain a 18 μm thick film. The coated film was taken into the i-line stepper and exposed to 40–360 (mJ/cm²) in 40 (mJ/cm²) steps as described above. The coated film was then developed by being impregnated with γ-butyrolactone/butyl acetate, and was further washed with propylene glycol monomethylether acetate.

The developed pattern was observed and measurements were taken for its film thickness. The sensitivity was evaluated based on the following factors (shown in Table 10):

(1) sensitivity indicated by ($E_{1/2}$), which is expressed in terms of exposure (mJ/cm²) required to obtain a final film thickness of 6 μm (film gain: 50%).
(2) practical sensitivity in terms of exposure (mJ/cm²) required to obtain a resolution of 6 μm for the pattern of openings.

TABLE 10

Sensitivity Evaluation

|  | Example 6 | Control 2 |
|---|---|---|
| Sensitivity ($E_{1/2}$) | 40 | 160 |
| Practical Sensitivity | 80 | 280 |

The pattern obtained in Example 6 was heated at 100° C. for 30 minutes, at 200° C. for 30 minutes, and at 350° C. for 60 minutes under a nitrogen atmosphere to obtain a polyimide pattern. The resulting polyimide pattern was 9.0 μm thick and had excellent pattern characteristics.

As is apparent from the above description, the photosensitive composition containing the hexaaryl biimidazole compound of the present invention exhibited a level of sensitivity 4–5 times higher than that of the hexaaryl biimidazole compound (Cl-HABI) known in conventional technology. Therefore, the photosensitive composition of the invention provides excellent patterning property under low exposure.

The hexaaryl biimidazole compound of the present invention is a highly sensitive photopolymerization initiator, and consequently provides an excellent pattern shape under low exposure, which has the added advantage that it can be developed by an aqueous basic solution.

The photosensitive composition of the present invention is characterized by its excellence in heat resistance and chemical resistance, thus provides such a polyimide film as to be applied to a protective film for surface coating of semiconductor elements or interlevel dielectric film of thin layer multilevel printed circuit boards, and the like.

The electronic components having the pattern of the present invention described above have excellent reliability.

It is intended that the above specification and examples be considered as illustrative only of the invention. Other embodiments of the present invention will be apparent to those skilled in the art from consideration of the specification and practice of the invention disclosed herein.

We claim:

1. A hexaaryl biimidazole compound represented by Formula (I):

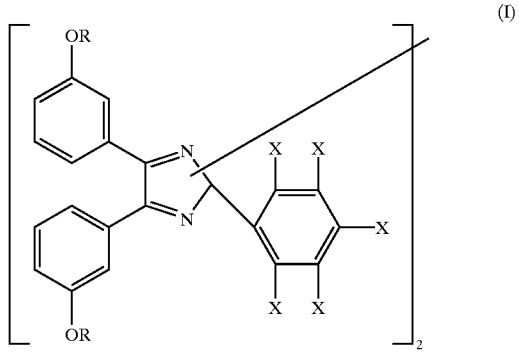

wherein each R group represents an alkyl group which may be the same or different, and each X group is independently a fluorine or hydrogen.

2. A hexaaryl biimidazole compound as set forth in claim 1, which is represented by Formula (Ia):

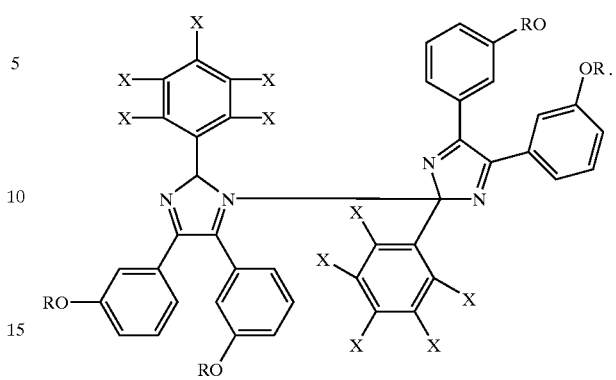

3. A hexaaryl biimidazole compound as set forth in claim 1, wherein all four R groups in Formula (I) are methyl groups.

4. A hexaaryl biimidazole compound as set forth in claim 3 wherein, in each of the two benzene rings having X groups as substituents in Formula (I), two or three X groups are fluorine atoms.

5. A hexaaryl biimidazole compound as set forth in claim 4, which is represented by Formula (II):

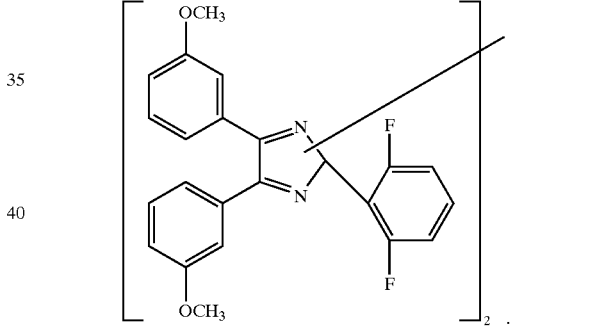

6. A hexaaryl biimidazole compound as set forth in claim 5, which is represented by Formula (IIa):

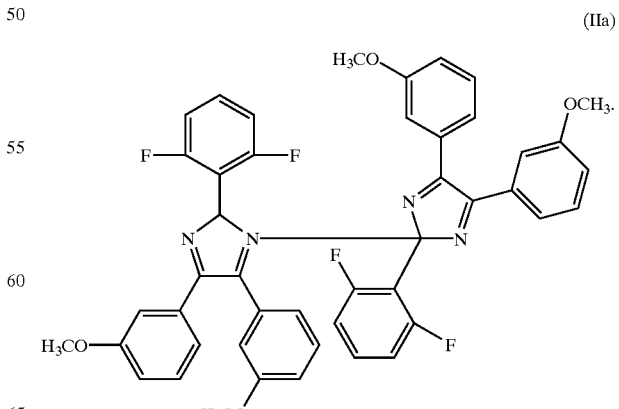

7. A hexaaryl biimidazole compound as set forth in claim 4, which is represented by Formula (III):

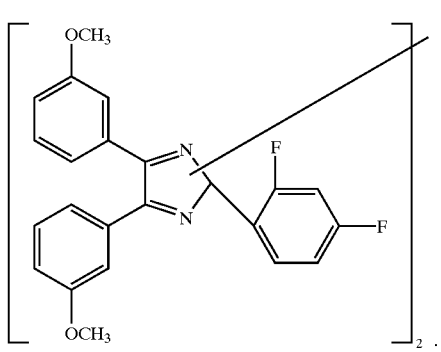

8. A hexaaryl biimidazole compound as set forth in claim 7, which is represented by Formula (IIIa):

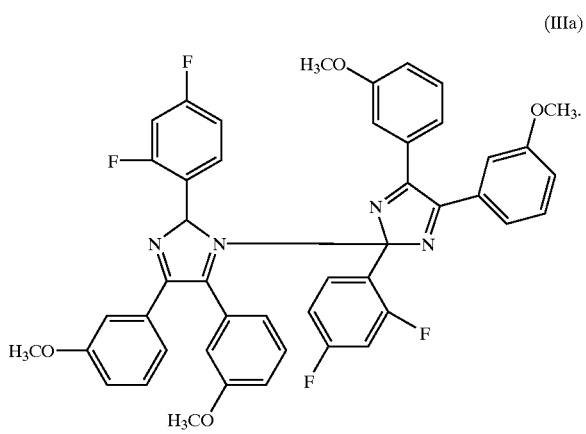

9. A photosensitive composition comprising:

(A) at least one photopolymerizable compound having a carbon-carbon double bond; and (B) at least one hexaaryl biimidazole compound represented by Formula (I):

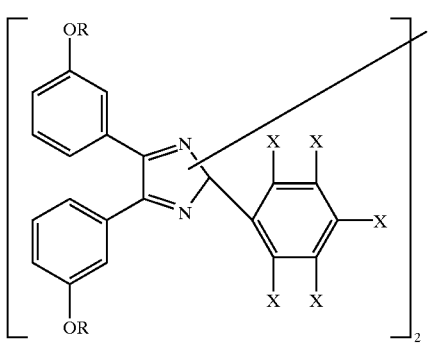

wherein each R group represents an alkyl group which may be the same or different, and each X group is independently a fluorine or hydrogen.

10. A photosensitive composition as set forth in claim 9, wherein the hexaaryl biimidazole compound is represented by Formula (Ia):

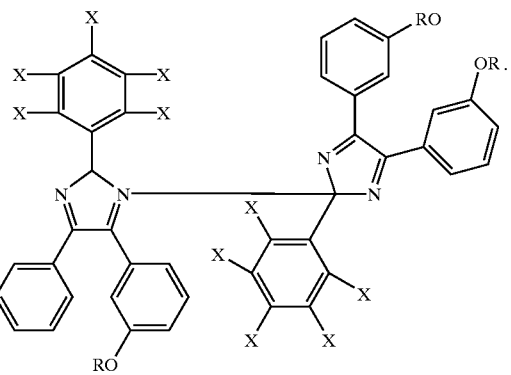

11. A photosensitive composition as set forth in claim 9, wherein all four R groups in Formula (I) are methyl groups.

12. A photosensitive composition as set forth in claim 11 wherein, in each of the two benzene rings having X groups as substituents in Formula (I), two or three X groups are fluorine atoms.

13. A photosensitive composition as set forth in claim 12, wherein said hexaaryl biimidazole compound is represented by Formula (I):

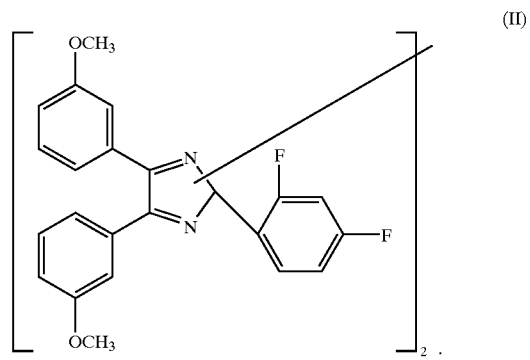

14. A photosensitive composition as set forth in claim 13, wherein said hexaaryl biimidazole compound is represented by Formula (IIa):

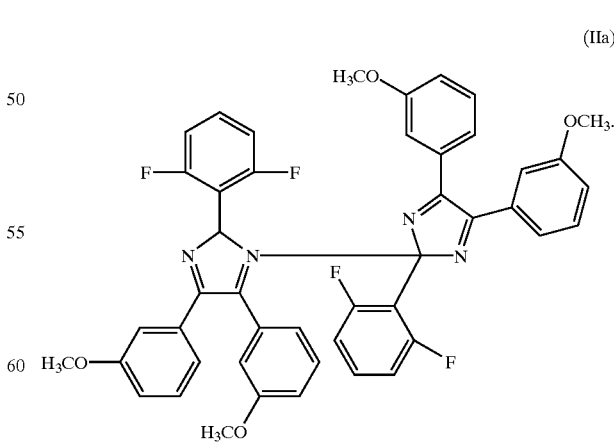

15. A photosensitive composition as set forth in claim 12, wherein said hexaaryl biimidazole compound is represented by Formula (III):

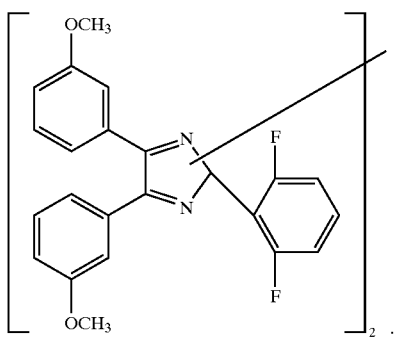

(III)

16. A photosensitive composition as set forth in claim 15, wherein hexaaryl biimidazole compound is represented by Formula (IIIa):

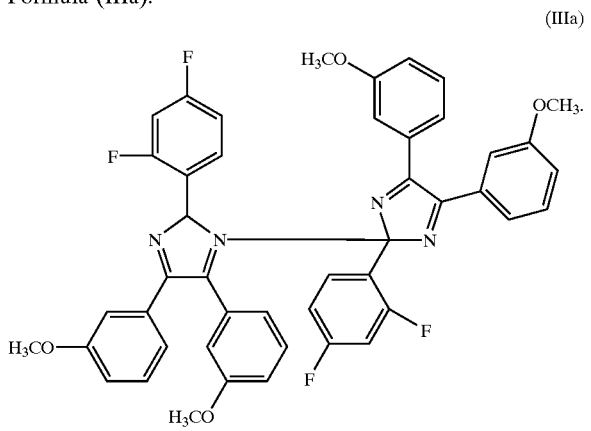

(IIIa)

17. A photosensitive composition as set forth in claim 9, wherein said component (A) is a photopolymerizable polyimide precursor having a carbon-carbon double bond.

18. A photosensitive composition as set forth in claim 9, which comprises:
 (1) 100 parts by weight of component (A), and
 (2) 0.1–20 parts by weight of component (B).

19. A photosensitive composition as set forth in claim 9, which contains a photopolymerizable compound having a boiling point of over 100° C. under atmospheric pressure.

20. A method of manufacturing a pattern comprising the steps of:
 (1) forming a film with a photosensitive composition of comprising: (A) at least one photopolymerizable compound having a carbon-carbon double bond; and (B) at least one hexaaryl biimidazole compound represented by Formula (I):

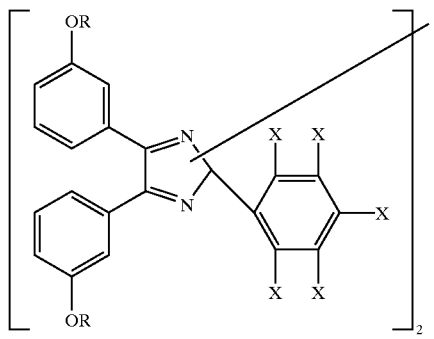

(I)

wherein each R group represents an alkyl group which may be the same or different, and each X group is independently a fluorine or hydrogen;

(2) irradiating light onto said film through a mask corresponding to said pattern; and
 (3) developing said film after the irradiation step in an organic solvent or a basic aqueous solution.

21. A method as set forth in claim 20, wherein the hexaaryl biimidazole compound is represented by Formula (Ia):

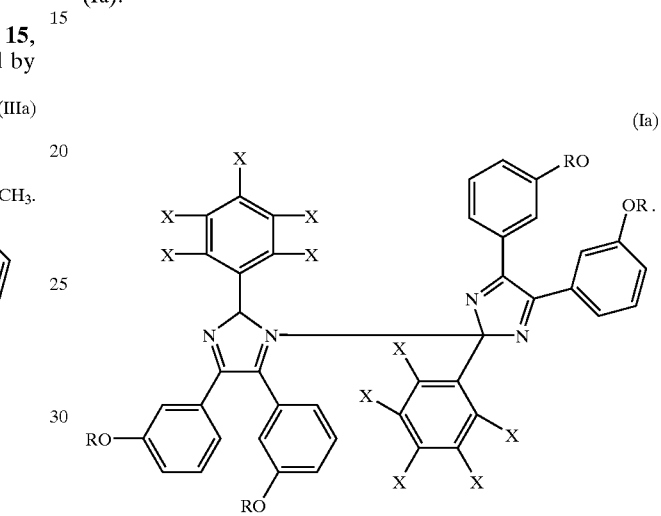

(Ia)

22. A method as set forth in claim 20, wherein all four R groups in Formula (I) are methyl groups.

23. A method as set forth in claim 22 wherein, in each of the two benzene rings having X groups as substituents in Formula (I), two or three X groups are fluorine atoms.

24. A method as set forth in claim 23, wherein said hexaaryl biimidazole compound is represented by Formula (II):

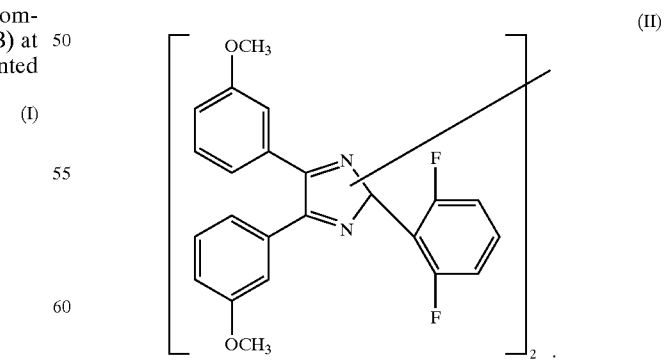

(II)

25. The method as set forth in claim 23, wherein said hexaaryl biimidazole compound is represented by Formula (IIa):

(IIa)

(IIIa)

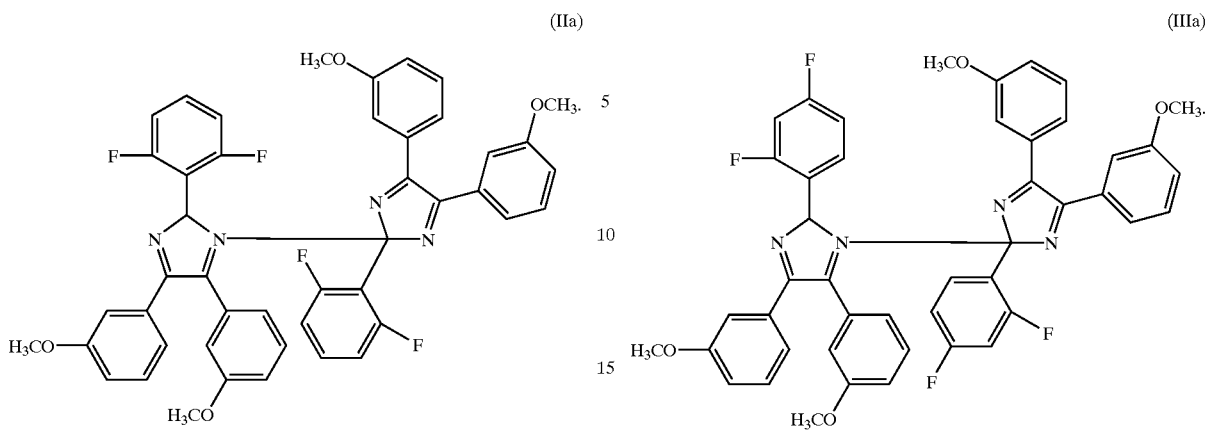

26. A method as set forth in claim 23, wherein said hexaaryl biimidazole compound is represented by Formula (III):

(III)

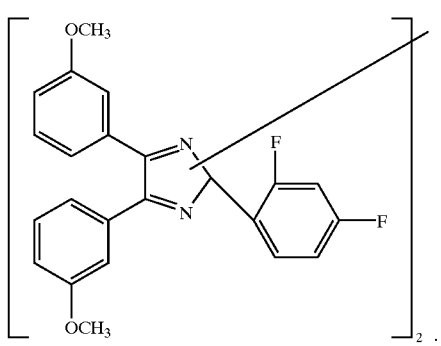

27. A method as set forth in claim 26, wherein said hexaaryl biimidazole compound is represented by Formula (IIIa):

28. A method as set forth in claim 20, wherein said component (A) is a photopolymerizable polyimide precursor having a carbon-carbon double bond.

29. A method as set forth in claim 20, wherein said composition comprises:
 (1) 100 parts by weight of component (A), and
 (2) 0.1–20 parts by weight of component (B).

30. A method as set forth in claim 20, wherein said composition contains a photopolymerizable compound having a boiling point of over 100° C. under atmospheric pressure.

31. A method as set forth in claim 20, wherein said composition further contains a hydrogen donor.

32. A method as set forth in claim 31, wherein the hydrogen donor is selected from the group consisting of arylglycines and mercapto compounds.

33. A method as set forth in claim 31, wherein said composition further contains a sensitizer.

34. A method as set forth in claim 20, wherein said developing step is performed in a basic aqueous solution.

* * * * *